United States Patent

Beurrier et al.

[15] 3,667,065

[45] May 30, 1972

[54] FEED-FORWARD AMPLIFIER HAVING ARBITRARY GAIN-FREQUENCY CHARACTERISTIC

[72] Inventors: Henry Richard Beurrier, Chester Township, Morris County; Harold Seidel, Warren, both of N.J.

[73] Assignee: Bell Telephone Laboratories, Incorporated, Murray Hill, N.J.

[22] Filed: Sept. 4, 1970

[21] Appl. No.: 69,757

[52] U.S. Cl. ...........................330/124 R, 330/149, 330/151

[51] Int. Cl. ..........................................................H03f 3/68

[58] Field of Search......................330/30 R, 124 R, 149, 151

[56] References Cited

UNITED STATES PATENTS 3,541,467 11/1970 Seidel ...............................330/149 X

*Primary Examiner*—Roy Lake
*Assistant Examiner*—James B. Mullins
*Attorney*—R. J. Guenther and Arthur J. Torsiglieri

[57] ABSTRACT

Frequency-shaping of the gain characteristic of a feed-forward, error-corrected amplifier using main and error amplifiers having essentially flat, or frequency-independent gain characteristics, is achieved by tapering the power division characteristics of: the input coupler, which extracts a reference signal component from the input signal; the sampling coupler, which compares the output from the main amplifier with the reference signal to form an error signal; and the error injection coupler, which injects the error signal into the main signal path. In a second embodiment of the invention, the band-shaping burden is shared between the amplifiers and the couplers.

4 Claims, 5 Drawing Figures

INVENTORS: H.R. BEURRIER
H. SEIDEL
BY
Sylvan Sherman
ATTORNEY

FEED-FORWARD AMPLIFIER HAVING ARBITRARY GAIN-FREQUENCY CHARACTERISTIC

This invention relates to feed-forward, error-corrected amplifiers.

BACKGROUND OF THE INVENTION

In an article entitled "Error-Controlled High Power Linear Amplifier at VHF," published in the May-June 1968 issue of the *Bell System Technical Journal*, pages 651–722, H. Seidel et al describe a low-noise, low-distortion amplifier employing feed-forward error correction. Specifically, the circuit described is particularly adapted to constant gain feed-forward amplifiers. In the copending application Ser. No. 819,247, filed Apr. 25, 1969, and assigned to applicants' assignee, now U.S. Pat. No. 3,541,467 the feed-forward technique was adapted to produce an overall frequency-dependent gain characteristic $F(\omega)$ using main and error amplifiers having, themselves, frequency-dependent gain characteristics.

The object of the present invention is to derive an overall frequency-dependent gain characteristic employing main and error amplifiers having essentially frequency-independent gain characteristics when arranged in a feed-forward, error-correcting configuration.

SUMMARY OF THE INVENTION

As in the prior art, a feed-forward amplifier in accordance with the present invention recognizes the passage of time. Error is determined in relationship to a time-shifted reference signal, and is corrected in a time sequence that is compatible with the main signal. Accordingly, the feed-forward amplifier comprises two parallel wavepaths. One path, called the main signal path, includes the main amplifier comprising one or more cascaded signal amplifiers, and operates upon the signal to be amplified in the usual manner. A second path, called the error signal path, and which includes an error amplifier, accumulates a replica of the errors introduced into the signal by the main signal amplifier. These error components, including both noise and intermodulation distortion, are accumulated at a level and in proper time and phase relationship so that they can be injected into the main signal path in a manner to cancel the error components in the main signal path.

Unlike the prior art, however, the main amplifier and the error amplifier, in accordance with one embodiment of the invention, have essentially flat, or frequency-independent gain characteristics over the frequency band of interest. Band-shaping is obtained primarily by shaping the power transfer characteristics of: the input power divider, which extracts a reference signal component from the input signal; the sampling coupler, which compares the output from the main amplifier with the reference signal component to form a difference or error signal; and the error injection coupler, which injects the error signal into the main signal path.

There are a number of important advantages in using amplifiers having flat gain characteristics. The first advantage resides in the fact that the phase characteristic of this type of amplifier is equivalent to a constant time delay. As such, delay equalization can be achieved by means of a simple length of transmission line. This avoids the use of more complicated delay equalizers which would serve to increase the potential for error as well as the amplifier cost.

A second advantage to the use of constant gain amplifiers resides in the relative ease of applying simple feed-forward, error-correction to each of the amplifiers, and then adding band-shaping to only the final, overall stage of correction. Thus, the main amplifier, and the error amplifier can, themselves be feed-forward, error-corrected amplifiers having flat, overall frequency characteristics. In such a multistage arrangement, the error-correction produced in the final band-shaping, feed-forward state is, correspondingly, less critical.

It is a further advantage of one aspect of the present invention that band-shaping is a function solely of passive circuit components and, hence, is more easily tailored to any specific band characteristics, and is more stable than the above-identified prior art arrangement wherein band-shaping was primarily dependent upon the gain characteristics of the main and error amplifiers.

In accordance with a second embodiment of the invention, the band-shaping burden is shared between the amplifiers and the couplers.

These and other objects and advantages the nature of the present invention, and its various features, will appear more fully upon consideration of the various illustrative embodiments now to be described in detail in connection with the accompanying drawings.

DETAILED DESCRIPTION

Figure 1:
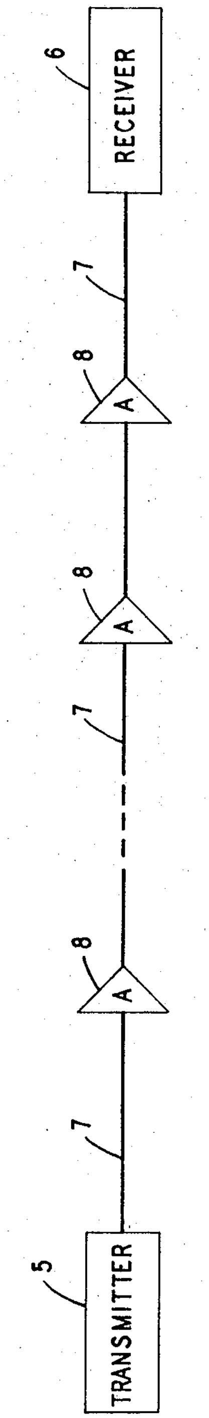
FIG. 1 shows, in block diagram, a long distance transmission system including amplifiers at spaced intervals therealong.

Referring to the drawings, FIG. 1 shows a communication system comprising a transmitter 5 and a receiver 6 connected by means of a transmission line 7. Because of the losses associated with transmission line 7, amplifiers 8 are included at regularly spaced intervals therealong.

The requirements placed upon the amplifiers will, of course, vary from system to system. One general requirement is that they amplify the transmitted signals in a manner to compensate for the losses incurred along the transmission line. Since these losses are, typically, not uniform, the gain characteristic of each amplifier (as a function of frequency) must be shaped so as to compensate for the particular loss characteristic of the transmission line. In general, transmission losses are higher at the higher frequencies. Accordingly, the gain of the amplifiers will be higher at these higher frequencies.

Finally, the amplifiers are, advantageously, designed to be as free of distortion as is economically feasible. For example, intermodulation distortion in a carrier communication system substantially limits the capacity of the system. Accordingly, any significant reduction in intermodulation distortion advantageously results in a corresponding increase in system capacity and economy.

As explained in the above-identified copending application, the desired amplifier characteristics are obtained by means of a feed-forward, error-correcting technique wherein the shaped gain characteristic is realized by tailoring the gain characteristics of the main and the error amplifiers, and the power transfer characteristic of the sampling coupler.

The present invention seeks to simplify the design of shaped feed-forward amplifiers by using amplifiers having essentially flat gain characteristics, and obtaining the desired gain characteristic by shaping the power transfer characteristics of only passive circuit elements. Thus, a feed-forward amplifier in accordance with the present invention comprises, as in the prior art, a pair of parallel wavepaths 10 and 11 including, in wavepath 10, a main amplifier 21 and a first delay network 22 and, in wavepath 11, a second delay network 23 and an error amplifier 24. Unlike the prior art, however, the gain G of the main amplifier, and the gain $g$ of the error amplifier are essentially constant over the frequency band of interest, while the power transfer properties of the input coupler and the error injection coupler are shaped in the manner now to be explained. In this connection, and for the purpose of illustration and explanation, it is specified that the two amplifiers have the same gain (i.e., $G=g$) and that the overall amplifier response $F(\omega)$ increases linearly on a log-log scale.

Figure 2:
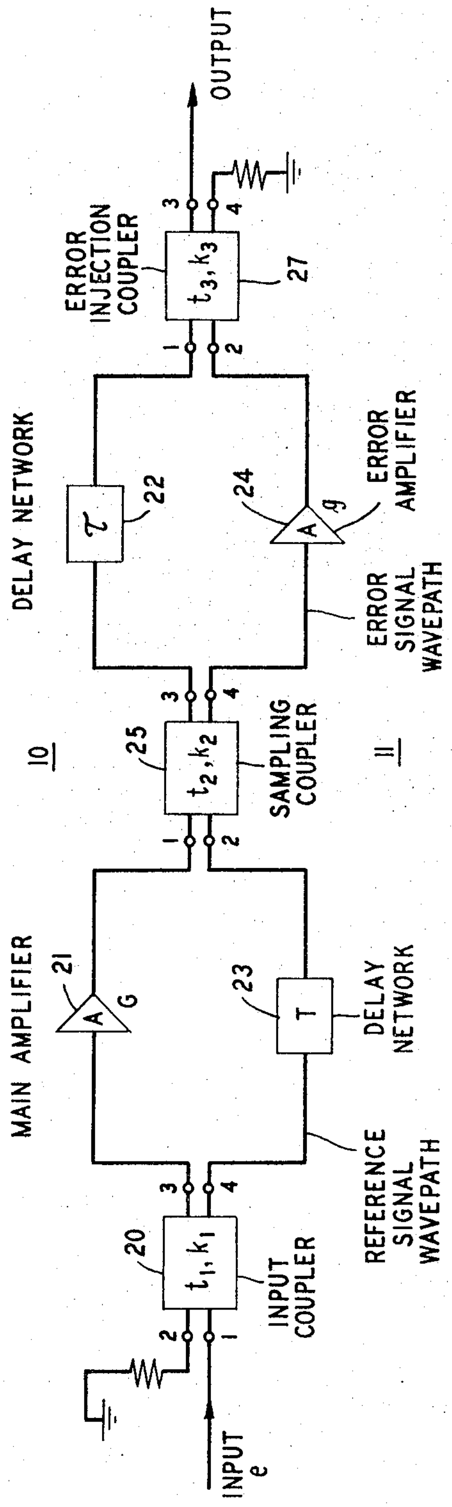
FIG. 2 shows a feed-forward amplifier, in accordance with the present invention, using main and error amplifiers having flat gain-frequency characteristics, and couplers having tapered power division characteristics.

Referring again to FIG. 2, the input signal $\epsilon$ is coupled to port 1 of input coupler 20, wherein it is divided into two, preferably unequal, components. Coupler 20 is a reactive four-port having two pair of conjugate ports 1–2 and 3–4. The smaller of the two components, i.e., the main signal (or simply, the signal) is coupled to port 3 from whence it is directed along the main signal path 10 to the input end of main signal amplifier 21. The other, large component is coupled to port 4 and along wavepath 11 to delay network 23. Port 2 of input coupler 20 is resistively terminated.

Figures 3A, 3B, 4:
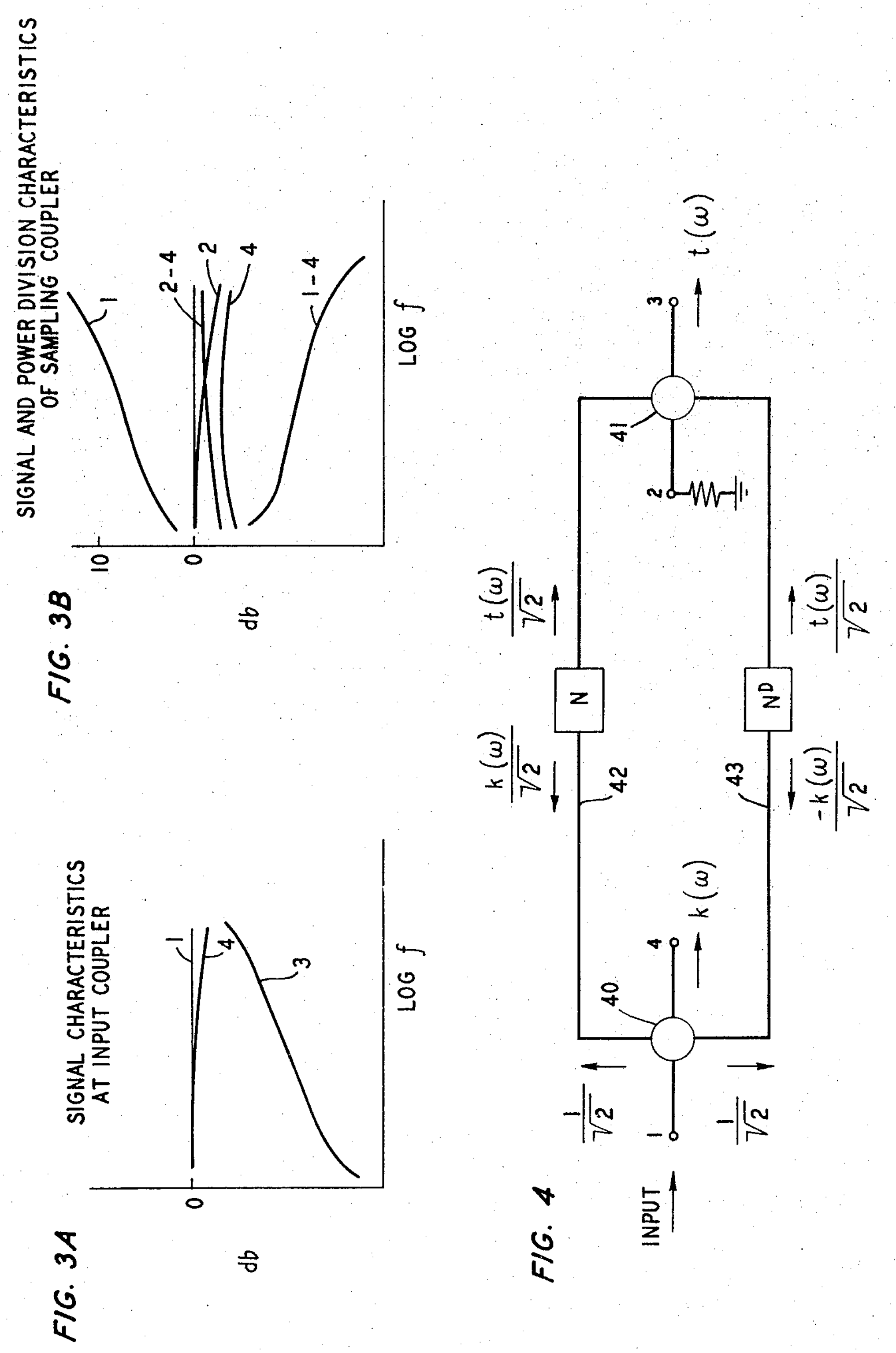
FIGS. 3A and 3B show the frequency characteristics at various locations within the amplifier of FIG. 2.
FIG. 4 shows an illustrative embodiment of a class of reactive four-ports having frequency-varying power division characteristics.

FIG. 3A shows the signal, in decibels, as a function of the logarithm of the frequency at the several ports of coupler 20. As shown, the input signal amplitude at port 1 is constant over the operating frequency band. As indicated, the greater portion of the input signal is coupled to port 4. Over the band of interest, this portion decreases slightly at the higher frequencies. The smaller portion of the input signal is coupled to port 3, and increases with increasing frequencies. At all frequencies, the sum of the power coupled to ports 3 and 4 is equal to the input power applied by port 1.

The curves of FIG. 3A show qualitatively, the power transfer characteristic for the particular overall amplifier response specified hereinabove. Quantitatively, for any arbitrary amplifier frequency-gain characteristic, $F(\omega)$, the coefficient of transmission $t_1$, and the coefficient of coupling $k_1$ of input coupler 20 are given by $$|t_1^2|=\frac{G^2+\sqrt{G^4+4(1-G^2)F(\omega)}}{2(G^2-1)} \qquad (1)$$

and $$|k_1^2|=1-|t_1^2|. \qquad (2)$$

The signal is amplified by amplifier 21, and a small portion of the amplifier signal is coupled into the error signal portion of wavepath 11, by means of sampling coupler 25, where it is compared with the time-delayed reference signal. Similar to the input coupler, the sampling coupler is a reactive four-port having two pairs of conjugate ports 1–2 and 3–4, of which: port 1 is connected to the output end of amplifier 21; port 2 is connected to delay network 23; port 3 is connected to delay network 22; and port 4 is connected to the input end of error amplifier 24.

As explained in the above-cited article by Seidel et al., isolation of error components introduced into the amplified signal by main amplifier 21 is accomplished by adjusting the relative amplitude, phase and time delay of the reference signal and the sampled signal such that the coherent signal components cancel, leaving only error components in the error signal wavepath. However, if the frequency variation of the signals applied at ports 1 and 2 of coupler 25, as illustrated in FIG. 3B, are compared, it is noted that they are incompatible. Since the main amplifier gain is uniform over the operating frequencies, the signal at port 1 of coupler 25 is merely an amplified replica of the amplifier input signal illustrated by curve 3 of FIG. 3A. Similarly, since the delay network is a linear passive network, the signal at port 2 of coupler 25 is likewise a replica of curve 4 of FIG. 3A Thus, in order to make a meaningful comparison, the frequency shaping introduced by coupler 20 must be taken into account in the design of sampling coupler 25. Indeed, the power transfer characteristic of the latter is basically the inverse of the former. Specifically, the coefficient of transmission $t_2$ and the coefficient of coupling $k_2$ of sampling coupler 25 are given by $$k_2=\frac{|t_1^2|}{F(\omega)} \qquad (3)$$

and $$|t_2^2|=1-|k_2^2|. \qquad (4)$$

Referring more specifically to the illustrative embodiment, the power transfer characteristics between ports 1–4 and 2–4 are also given in FIGS. 3B by curves 1–4 and 2–4. So shaped, the power transfer characteristic 1–4, operating upon the amplified main signal applied to port 1, and the power transfer characteristic 2–4, operating upon the reference signal applied to port 2, produce identical coherent signals at port 4, as given by curve 4. Being equal in amplitude, in time coincidence and 180° out of phase, the coherent signal components cancel over the frequency band of interest, leaving only error components at the input terminal of the error amplifier.

The bulk of the amplified signal is coupled to port 3 of the sampling coupler, and then through delay network 22 to port 1 of error injection coupler 27. Since this signal has a rising characteristic, the higher frequency error components are relatively larger than the lower frequency components. The variation across the band is essentially that defined by the coefficient of coupling of input coupler 20. However, since the gain of error amplifier 24 is flat over the band of interest, and since the error signals applied to the error amplifier also have a flat characteristic, it is apparent that in order to cancel over the frequency band of interest, the error injection coupler must have a taper power transfer characteristic to match that of the signal in the main signal path. Indeed, for the assumed condition of equal gain in the main and error amplifiers, the coefficient of transmission, $t_3$, and the coefficient of coupling, $k_3$, for the error injection coupler are the same as for the input coupler. That is, $$t_3=t_1 \qquad (5)$$

and $$k_3=k_1. \qquad (6)$$

One of the assumptions made hereinabove was that the main amplifier and the error amplifier had the sane gain G. This, however, is not at all necessary to the operation of the invention. In the more general case, the main amplifier gain, G, and the error amplifier gain, $g$, will be different, and the coupler coefficients will also differ correspondingly. Specifically, the input coupler coefficient of transmission $t_1$ is related to the system parameters by the following quadratic equation in $t_1^2$:

$$(t_1^2)^2(G^2-1)-t_1^2\left[G^2-F^2(\omega)\left(1-\frac{G^2}{g^2}\right)\right]+\left(\frac{G}{g}\right)^2F^2(\omega)=0 \qquad (7)$$

The coefficient of transmission $t_2$ for the sampling coupler is then given in terms of $t_1$ by $$t_2^2=\frac{G^2(1-t_1^2)}{t_1^2+G^2(1-t_1^2)} \qquad (8)$$

and the coefficient of transmission $t_3$ for the error injection coupler is given in terms of $t_1$ by $$t_3^2=\frac{1}{1+\left(\frac{G}{g}\right)^2\left(\frac{1-t_1^2}{t_1^2}\right)} \qquad (9)$$

In each instance, the coefficient of coupling $k_i$ is related to the coefficient of transmission $t_i$ by $$|k_i^2|+|t_i^2|=1. \qquad (10)$$

In the discussion hereinabove, the three couplers are characterized as reactive four-ports whose coefficients of transmission and coupling vary over the frequency band of interest as prescribed by equations (7), (8), (9) and (10). While it is apparent that the specifics of the coupler will vary, depending upon the desired overall gain characteristic $F(\omega)$, some general comments can be made and an illustrative coupler described.

The simplest couplers are the so-called "hybrid couplers" which can be divided into two general classes. In one class, which includes the "magic-tee," the input signal is divided into two components which are either in phase or 180° out of phase. In the second class of couplers, the so-called "quadrature couplers," the divided signal components are always 90° out of phase.

Being reactive four-ports, both classes of couplers are characterized by two coupling coefficients $t$ and $k$, which vary as a function of frequency. In general, however, they will not necessarily vary in a manner to satisfy equations (7), (8), (9) and (10). It will, therefore, be necessary to devise more complex coupling circuits, as is illustrated, for example, in FIG. 4.

The coupler illustrated in FIG. 4 is a reactive, four-port comprising a pair of broadband hybrid junctions 40 and 41, interconnected by means of two wavepaths 42 and 43. Wavepath 42 includes a reactive two-port network N whose coefficient of transmission $t(\omega)$ and coefficient of reflection $k(\omega)$ have the required frequency characteristic for the respective coupler, as dictated by equation (7), (8) or (9) and equation (10). This network can be synthesized in accordance with the techniques disclosed by S. Darlington in his paper entitled "Synthesis of Reactance 4-Poles," published in the *Journal of Mathematic Physics*, Vol. 30, Sept. 1939, pp. 257–353.

The other wavepath also includes a two-pole reactive network $N^D$, which is the dual of network N. As such, it has the same coefficient of transmission $t(\omega)$ as network N, but the coefficient of reflection $-K(\omega)$ is the negative of network N.

In operation, signals, over the band of interest, applied at port 1 divide equally between the two wavepaths 42 and 43. For a unit amplitude input signal, the incident signal components in wavepaths 42 and 43 are equal to $\frac{1}{\sqrt{2}}$.

A portion $$\frac{t(\omega)}{\sqrt{2}}$$

of each signal is transmitted by networks N and $N^D$, and recombined in hybrid 41 to produce an output signal $t(\omega)$ at port 3. The other portion of each signal is reflected by networks N and $N^D$ to produce two reflected signal components $$\frac{k(\omega)}{\sqrt{2}}$$

and $$-\frac{k(\omega)}{\sqrt{2}}$$

. These combine in hybrid 40 to produce an output signal $k(\omega)$ at port 4, thus realizing the required coupler characteristic. Clearly, other coupling networks can just as readily be devised by those skilled in the art. In this connection, see the copending application by H. Seidel, Ser. No. 776,398, filed Nov. 18, 1968 and assigned to applicants' assignee.

It will be recognized that the feed-forward amplifier described hereinabove, and the feed-forward amplifier described in the above-cited copending application by H. Seidel, represent extreme situations. In the instant case, the amplifiers have flat gain characteristics over the band of interest, and band-shaping is a function solely of the couplers. In the copending application, the input and the error injection couplers have flat characteristics, and band-shaping is a function of the main and error amplifier gain characteristics. Obviously, there is an area between these two extremes wherein the overall band-shaping burden is shared between the amplifiers and the couplers. It will be recognized, however, that if the individual amplifiers have shaped gain characteristics, it may complicate the design of the delay equalizers. On the other hand, it can simplify the coupler designs. In connection with the latter, if the amplifiers have frequency-dependent gain characteristics, the gain functions $G(\omega)$ and $g(\omega)$ are substituted for $G$ and $g$ in the various equations for the coupler coefficients $t$ and $k$.

Accordingly, it is understood that the above-described arrangements are illustrative of but a small number of the many possible specific embodiments which can represent applications of the principles of the invention. For esample, as noted above, the main amplifier and the error amplifier, or both, can themselves be feed-forward amplifiers. Such multiple loop arrangements are more fully described in U.S. Pat. No. 3,471,798, issued to H. Seidel on Oct. 7, 1969. Thus, numerous and varied other arrangements can readily be devised in accordance with these principles by those skilled in the art without departing from the spirit and scope of the invention.

What is claimed is:

1. A feed-forward electromagnetic signal amplifier having an arbitrary gain-frequency characteristic $F(\omega)$ over a frequency band of interest comprising:
   first and second wavepaths;
   the first of said wavepaths including, in cascade, a main signal amplifier and a first delay network;
   the second of said wavepaths including, in cascade, a second delay network and an error amplifier;
   input means for dividing an input signal into components and for coupling a different one of said components to the input end of each of said wavepaths;
   sampling means for coupling a portion of the signal output from said main amplifier to the input to said error amplifier;
   and error injection means for coupling the output from said error amplifier into said first wavepath in time and phase to minimize error components in the output signal;
   characterized in that: g
   said input means, said sampling means and said error injection means are reactive networks having two pairs of conjugate ports, and each of which has a coefficient of transmission $t_i$ and a coefficient of coupling $k_i$ which vary as a function of $F(\omega)$, where $$|t_i|^2+|k_i|^2=1.$$

2. The amplifier according to claim 1 wherein the gain characteristic of the main amplifier and the gain characteristic of the error amplifier are independent of frequency over the band of interest.

3. The amplifier according to claim 1 where the gain characteristic of the main amplifier and the gain characteristic of the error amplifier vary as a function of frequency.

4. The amplifier according to claim 1 wherein the coefficients of transmission $t_1$, $t_2$ and $t_3$, of said input means, said sampling means and said error injection means are given, respectively, by $$(t_1^2)^2(G(\omega)^2-1)-t_1^2\left[G(\omega)^2-F(\omega)^2\left(1-\frac{G(\omega)^2}{g(\omega)}\right)\right]+\left(\frac{G(\omega)}{g(\omega)}\right)^2F(\omega)^2=0;\ t_2^2=\frac{G(\omega)^2(1-t_1^2)}{t_1^2+G(\omega)^2(1-t_1^2)}$$

and $$t_3^2=\frac{1}{1+\left(\frac{G(\omega)}{g(\omega)}\right)^2\left(\frac{1-t_1^2}{t_1^2}\right)}$$

where $G(\omega)$ and $g(\omega)$ are the gain characteristics of the main amplifier and the error amplifier, respectfully.

* * * * *